(12) United States Patent
Hueting et al.

(10) Patent No.: US 6,319,777 B1
(45) Date of Patent: Nov. 20, 2001

(54) TRENCH SEMICONDUCTOR DEVICE MANUFACTURE WITH A THICKER UPPER INSULATING LAYER

(75) Inventors: Raymond J. E. Hueting, Helmond; Cornelis E. Timmering; Henricus G. R. Maas, both of Eindhoven, all of (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/840,816

(22) Filed: Apr. 24, 2001

(30) Foreign Application Priority Data

Apr. 26, 2000 (GB) .................................................. 0010041

(51) Int. Cl.[7] .............................................. H01L 21/336
(52) U.S. Cl. ......................... 438/270; 438/259; 438/589
(58) Field of Search .................................... 438/138, 259, 438/268, 270, 589, 981

(56) References Cited

U.S. PATENT DOCUMENTS 5,242,845 * 9/1993 Baba et al. ............................ 438/270
5,753,554 * 5/1998 Park ...................................... 438/270
5,770,514 * 6/1998 Matsuda et al. ...................... 438/589

FOREIGN PATENT DOCUMENTS

3932621 * 4/1990 (DE) .
9943029A1 8/1999 (WO) .

* cited by examiner

Primary Examiner—Chandra Chaudhari
(74) Attorney, Agent, or Firm—Steven R. Biren

(57) ABSTRACT

In the manufacture of semiconductor devices that have an electrode (11,41) in an insulated trench (20), for example a trench-gate MOSFET, process steps are performed to line the trench walls with a lower insulating layer (21) in a lower part of the trench and with a thicker upper insulating layer (22) in an upper part of the trench. The steps include: (a) etching the trench (20); (b) providing the lower insulating layer (21) on the trench walls; (c) depositing on the lower insulating layer (21) a further layer (51) of a different material; (d) depositing on the further layer (51) a filler material (52) that is of a different material from the further layer (51); (e) etching away the further layer (51) from the upper part of the trench walls while using the filler material (52) as an etchant mask, so as to form a space (50) adjacent to the upper part of the trench walls while leaving the further layer (51) in the lower part of the trench; and (f) providing the thicker upper insulating layer (22) in the space (50) adjacent to the upper part of the trench walls.

17 Claims, 6 Drawing Sheets

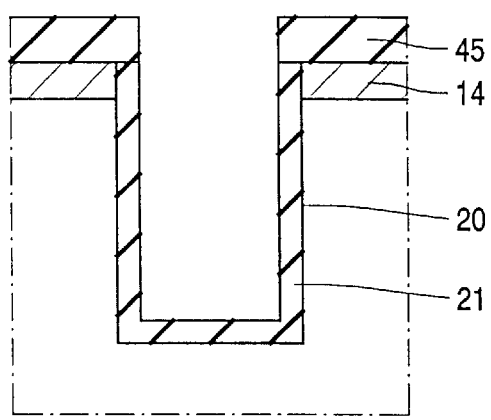
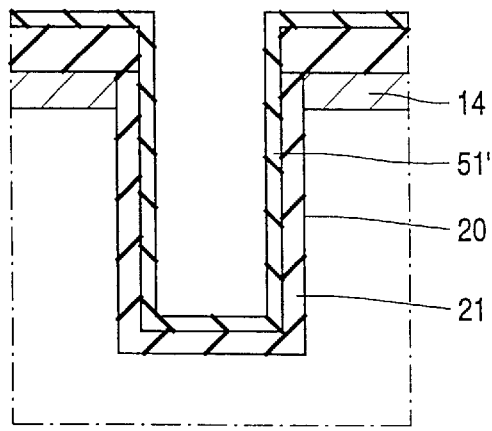
FIG. 4A    FIG. 4B
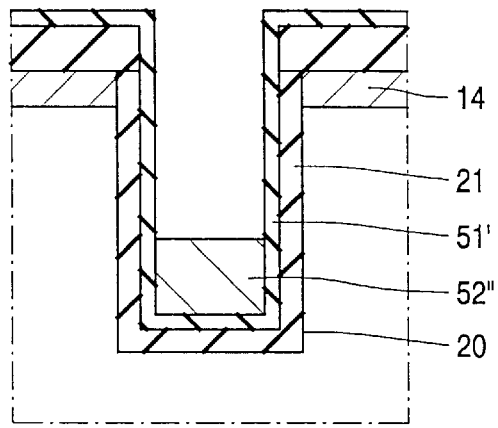
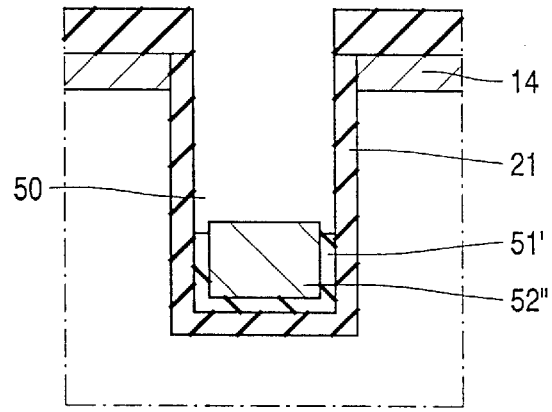
FIG. 4C    FIG. 4D
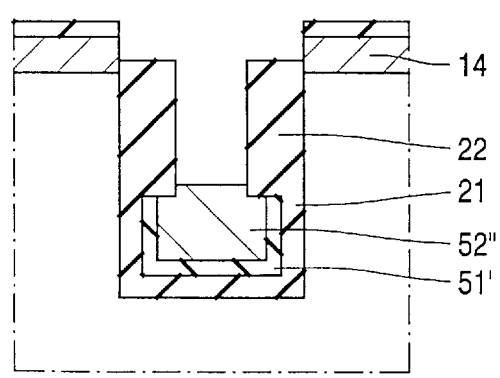
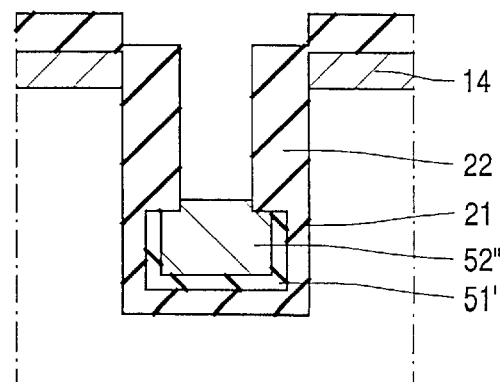
FIG. 4E    FIG. 4F

TRENCH SEMICONDUCTOR DEVICE MANUFACTURE WITH A THICKER UPPER INSULATING LAYER

This invention relates to methods of manufacturing semiconductor devices that have an electrode in an insulated trench, for example as a trench-gate of a power MOSFET or other field-effect device. The invention relates particularly to process steps for lining the trench walls with a lower insulating layer in a lower part of the trench and with a thicker upper insulating layer in an upper part of the trench.

Published PCT patent application WO 99/43029 describes a trench-gate MOS transistor having a lower insulating layer lining a lower part of the trench and a thicker upper insulating layer lining an upper part of the trench. Source-drain regions are present adjacent to the thicker upper insulating layer. Embodiments of the transistor are disclosed that are suitable for EEPROM devices. In an EEPROM embodiment, the trench-gate extends into (but not through) a channel-accommodating region, and the source and drain regions are located at the same surface of the body, but at opposite sides of the trench-gate. The whole contents of WO 99/43029 are hereby incorporated herein as reference material.

WO 99/43029 describes and claims a process for forming the insulated trench by process steps that include:
 etching a wide but shallow trench into the semiconductor body from one surface of the body,
 filling the wide shallow trench with insulating material for forming the upper insulating layer on the trench walls,
 etching a narrow but deep trench into the semiconductor body through the insulating filling of the wide shallow trench,
 forming the lower insulating layer on the etched surfaces of the narrow deep trench below the wide shallow trench.

This process requires a photolithographic alignment of a mask defining the narrow deep trench in relation to the wide shallow trench. A lateral displacement error in this alignment renders the upper insulating layer thicker on one side of the trench than on the other side.

It is an aim of the present invention to provide an alternative adaptable process in which the definition of a thicker upper insulating layer in an upper part of the trench can be self-aligned with a lower insulating layer in a lower part of the trench.

According to the present invention, the insulated trench is formed by process steps that include:
 (a) etching the trench into a semiconductor body from one surface of the body,
 (b) providing the lower insulating layer on the trench walls,
 (c) depositing on the lower insulating layer a further layer of a different material from that of the lower insulating layer,
 (d) depositing on the further layer a filler material that is of a different material from the further layer,
 (e) etching away the further layer from the upper part of the trench walls while using the filler material as an etchant mask, so as to form a space adjacent to the upper part of the trench walls while leaving the further layer in the lower part of the trench,
 and (f) providing the thicker upper insulating layer in the space adjacent to the upper part of the trench walls.

Such a process approach not only permits the desired self-alignment but also is readily implemented in a variety of electrode and insulator technologies suitable for use in a wide variety of devices. Several particularly advantageous features and options available with the invention are set out in the appended Claims.

Thus, for example, the filler material and the further layer of different material may be selectively etchable with respect to each other, and one or other may be oxidation-resistant, and/or an electrode material of the device, and/or an insulating material of the device. The filler material may be used in both the lower and upper parts of the trench, or in just one part of the trench.

The filler material and/or the further layer may be retained in the manufactured device or removed.

The bottom of the trench may be free of the lower insulating layer, so that the electrode may contact a region of the body at the bottom of the trench. Thus, the trench may provide an insulated via for the electrode from the surface of the body to a buried region of the body. In the case of a discrete device or integrated circuit comprising a transistor, this electrode may be, for example, a collector connection or a drain connection.

The invention is particularly useful for providing compact insulated trench-gate structures in field-effect devices. Thus, the trench may be etched into a channel-accommodating region of the device. The lower insulating layer may be provided on the bottom of the trench as well as on the lower part of its side walls. Source and/or drain regions may be formed in the body adjacent to the thicker upper insulating layer.

This trench-gate field-effect structure may be used for an EEPROM, for example as in WO 99/43029. However, the invention is of particular utility for a power MOSFET comprising a pattern of transistor cells bounded by the trench-gate. It is particularly useful to provide the thicker insulating layer between the transistor drain and the gate. Thus, the field-effect device may be an inverted transistor having drain regions adjacent to the thicker upper insulating layer. The trench may extend through the thickness of the channel-accommodating region to reach an underlying source region adjacent to the lower insulating layer.

These and other features of the present invention are illustrated in embodiments of the invention now described, by way of example, with reference to the accompanying drawings, in which:

FIGS. 4A to 4G are similar cross-sectional views of a trench-gate area of the MOSFET at successive stages in its manufacture by process steps in accordance with a further embodiment of the invention, with a further layer that may be kept in the device;

Figure 1:
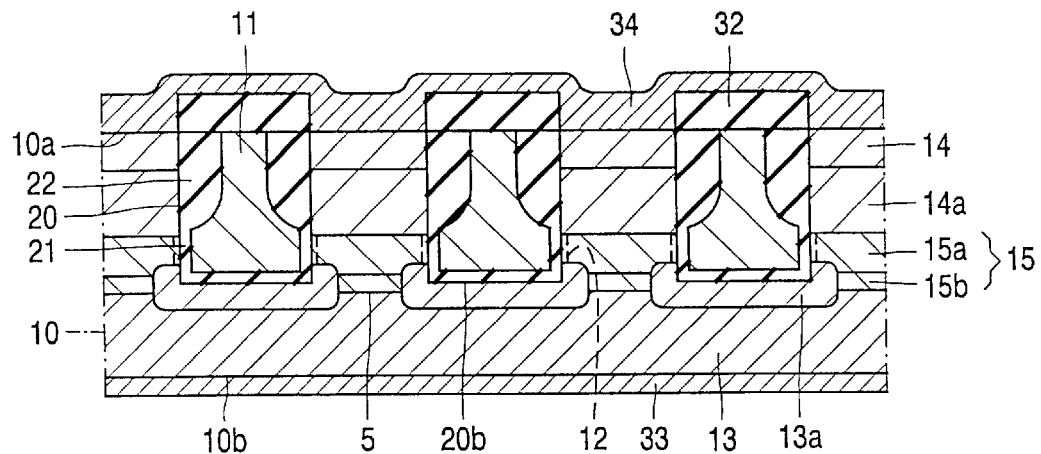
FIG. 1 is a cross-sectional view of an active central part of a trench-gate power MOSFET manufactured by a method in accordance with the invention.

It should be noted that all the Figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1 illustrates an exemplary embodiment of a cellular trench-gate field-effect power transistor manufactured in accordance with the invention. The transistor comprises a semiconductor body 10 having a top major surface 10a from which a trench 20 with a trench-gate structure 11,21,22 extends into the body 10. The transistor is of the MOSFET type comprising a gate electrode 11 on a gate dielectric layer 21. The layer 21 lines a lower part of the trench 20, including its bottom 20b. This insulated trench-gate 11 extends through a channel-accommodating portion 15a of a body region 15 of a first conductivity type (p-type in this embodiment), between drain and source regions 14 and 13 of an opposite second conductivity type (n-type in this embodiment). The application of a voltage signal to the gate electrode 11 in the on-state of the device serves in known manner for inducing a conduction channel 12 in the region portion 15a and for controlling current flow in this conduction channel 12 between the source and drain regions 13 and 14.

The transistor is of an inverted configuration, in which the drain region 14 is adjacent to the top surface 10a. Thus, the trench 20 extends through the regions 14 and 15 into an underlying portion 13a of the source region 13. The drain region 14 is contacted at the top major surface 10a by a drain electrode 34. The drain electrode 34 extends over the trench-gate 11 from which it is insulated by an intermediate insulating layer 32. A drain drift region 14a of lower doping concentration (n−) than the drain region 14 (n+) is present between the drain region 14 and the underlying body region 15. The adjacent upper part of the trench 20 is lined with an upper dielectric layer 22 that is thicker than the gate dielectric 21 in the lower part of the trench 20. The upper part of the gate electrode 11 on this thicker dielectric 22 acts as a field plate.

In the inverted configuration of this transistor, a part of the body region 15 is electrically shorted to the underlying source region 13 by a buried electrical short 5 in the form of a leaky p-n junction. A highly doped bottom portion 15b (p+) forms the leaky p-n junction 5 with the source region 13 at an area that is separated laterally from the trench-gate structure 11,12 by an active portion 13a of the source region 13 adjacent to the trench-gate structure 11,12. This short 5 pins the potential of the body region 15 to that of the source region 13. By way of example, FIG. 1 shows a discrete vertical device structure in which the source region 13 is a substrate of high conductivity (n+in this example), that is contacted by the source electrode 33 at the bottom major surface 10b of the body 10.

The transistor of FIG. 1 typically comprises tens of thousands of parallel device cells in the semiconductor body 10 adjacent to the body surface 10a. The number of cells is dependent on the desired current-carrying capability of the device. Trench-gate transistors manufactured in accordance with the invention may have any one of a variety of known cell geometries, for example an hexagonal close-packed geometry, or a square geometry, or an elongate stripe geometry. In each case, the device has a plurality of the body regions 15 which are located side-by-side in the semiconductor body 10, and the trench-gate structure 11,21,22 comprises grid portions which extend between the channel-accommodating portions 15a of the neighbouring side-by-side body regions 15, as illustrated in FIG. 1. The source region 13 is common to all the cells. The active cellular area of the device may be bounded around the periphery of the body 10 by various known peripheral termination schemes. Such schemes normally include the formation of a thick field-oxide layer at the peripheral area of the body surface 10a, before the transistor cell fabrication steps.

Typically, the body 10 is of monocrystalline silicon, the trench-gate electrode 11 typically comprises doped polycrystalline silicon on a gate insulating layer 21 that comprises silicon dioxide, and the electrodes 33 and 34 are of, for example, aluminium. In a typical embodiment, the doping concentration (p+) of the high-doped portion 15b may be, for example, $10^{18}$ to $10^{19}$ boron atoms $cm^{-3}$, that (p) of the channel-accommodating portion 15a may be, for example, $10^{16}$ to $10^{17}$ boron atoms $cm^{-3}$, that (n+) of the active source portion 13a of the may be, for example, $10^{19}$ to $10^{21}$ phosphorus or arsenic atoms $cm^{-3}$, and the dopant concentration (n+) of the source and drain regions may be, for example, $10^{20}$ to $10^{22}$ phosphorus or arsenic atoms $cm^{-3}$. The lower-doped drain drift region 14a may have a doping concentration (n−) that is uniform or that reduces with depth, for example from about $3\times10^{17}$ at the interface with drain region 14 to about $10^{16}$ at the interface with the body region 15.

In the case of the discrete vertical device structure illustrated in FIG. 1, the highly doped bottom portion 15b of the body region 15, the channel-accommodating portion 15a of the body region 15, the drain drift region 14a and the drain region 14 may be formed as a stack of epitaxial layers on the substrate 13. In this case, the layer that forms the highly doped bottom portion 15b of the body region 15 extends laterally to the trench-gate structure 11,12 where it is overdoped by the active portion 13a of the source region 13.

The insulated trench structure 20,21,22 is formed by process steps in accordance with the present invention. In overview, these steps include:

(a) etching the trench 20 into the body 10 from the surface 10a, (b) providing the lower insulating layer 21 on the trench walls, (c) depositing on the lower insulating layer 21 a further layer 51 of a different material from that of the lower insulating layer 21, (d) depositing on the further layer 51 a filler material 52 that is of a different material from the further layer 51, (e) etching away the further layer 51 from the upper part of the trench walls while using the filler material 52 as an etchant mask, so as to form a space 50 adjacent to the upper part of the trench walls while leaving the further layer 51 in the lower part of the trench, and (f) providing the thicker upper insulating layer 22 in the space 50 adjacent to the upper part of the trench walls.

Various specific embodiments with different material technologies will now be described with reference to FIGS. 2A to 2G, FIGS. 3A to 3D, FIGS. 4A to 4G, and FIGS. 5A to 5H.

FIRST EMBODIMENT

FIGS. 2A to 2G

This embodiment uses a sacrificial filler material 52 and employs an electrode material for the further layer 51. The electrode material (for example, silicon) for the further layer 51 is selectively etchable with respect to the sacrificial filler material 52 (for example, silicon nitride).

The trench 20 is etched in known manner into the surface 10a of the silicon body 10, for example at a window in an insulating layer 45. The thin gate dielectric layer 21 may then be formed in known manner (for example, by oxidation of the silicon trench walls, or by deposition of silicon dioxide) to line the walls and bottom of the trench 20.

Figure 2A:
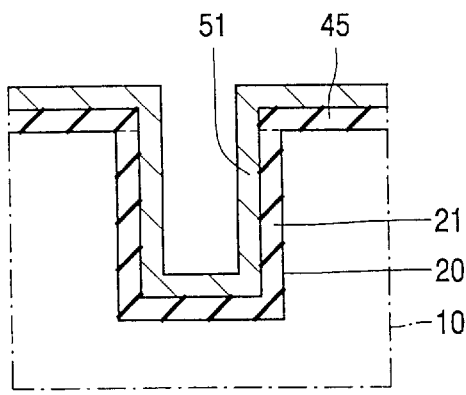
FIGS. 2A to 2G are cross-sectional views of a trench-gate area of such a MOSFET at successive stages in its manufacture by process steps in accordance with one embodiment of the invention, with a sacrificial (silicon nitride) filler material.

Next, an electrode material (for example, doped polycrystalline silicon) is deposited to form the further layer 51. The resulting structure is illustrated in FIG. 2A. The layer 51 is typically more than 0.15 μm (micrometres) thick, depending on the desired drain voltage for the device. The thickness of the layer 51 determines the width of the space 50 that is formed later (FIG. 2C) in this embodiment, and hence the thickness of the upper insulating layer 22.

Figure 2B:
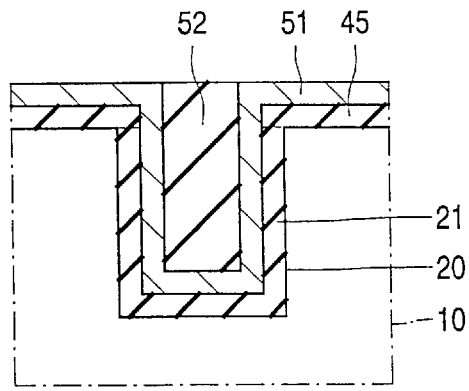

A sacrificial filler material 52 such as silicon nitride is then deposited over the layer 51 and is etched back so as to be left only in the trench 20. This filler material 52 extends in both the lower and upper parts of the trench 20. The resulting structure is illustrated in FIG. 2B.

Figure 2C:
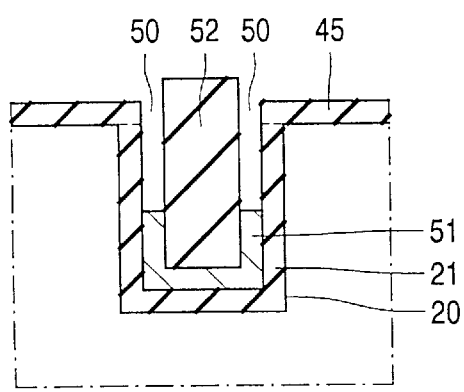

The exposed polycrystalline silicon is then etched away, for a time sufficient to remove the further layer 51 from the upper part of the trench walls. As illustrated in FIG. 2C, the space 50 is formed between the upper part of the filler material 52 and the upper part of the trench walls.

Figure 2D:
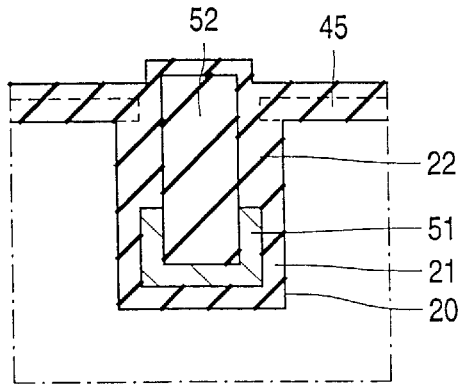

Insulating material (typically, silicon dioxide in the form of TEOS) is then deposited to provide the thicker upper insulating layer 22 in the space 50 between the filler material 52 and the upper part of the trench walls. The silicon dioxide material 22 also deposits over the filler material 52. The resulting structure is illustrated in FIG. 2D.

Figure 2E:
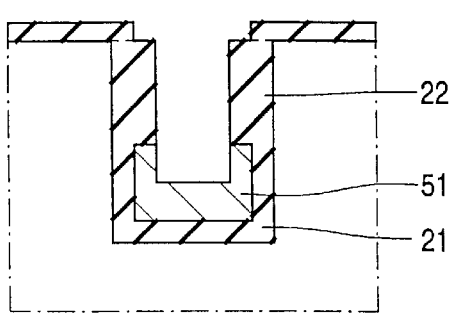

The silicon dioxide is etched back (or chemically mechanically polished) to re-expose the silicon nitride filler material 52. Thereafter, a selective etchant is used to etch away the filler material 52 from the upper insulating layer 22 of silicon dioxide and from the polycrystalline silicon layer 51. The resulting structure is illustrated in FIG. 2E.

Figure 2F:
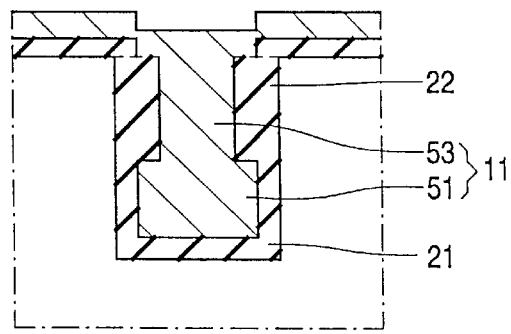

Doped polycrystalline silicon 53 may then be deposited to form (with the existing polycrystalline silicon layer 51) the gate electrode 11 in the insulated trench 20,21,22. Thus, in this embodiment, the remainder of the layer 51 is retained in the manufactured device as a lower part of the electrode 11. The polycrystalline silicon also deposits on the top of the body. The resulting structure is illustrated in FIG. 2F.

Figure 2G:
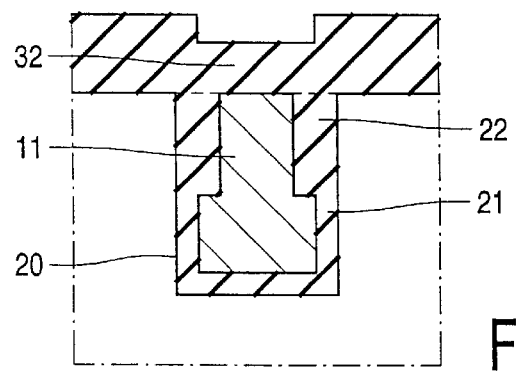

Thereafter, the excess polycrystalline silicon is etched away from the top of the body, and another TEOS oxide layer 32 may be deposited over the trench-gate structure 11,21,22. The resulting structure is illustrated in FIG. 2G.

In a modification of the FIGS. 2C to 2D stages of this embodiment, the upper insulating layer 22 of silicon dioxide may be formed by oxidation of the upper trench walls. During the oxidation, the silicon nitride material 52 can be used as an oxidation mask on the polycrystalline silicon layer 51, although it is preferable for the thickness of the nitride material 52 to be reduced so as to reduce stress. In this case, because the layer 22 grows into the trench walls, the resulting oxide layer 22 is thicker than the width of the space 50. Thereafter, the remaining silicon nitride material 52 is etched away from the silicon dioxide layer 22 with a selective etchant.

Instead of silicon nitride, other materials can be used for the sacrificial filler 52 in other variants of the process with a deposited layer 22. Thus, for example, p+ (heavily boron doped) polycrystalline silicon may be used for the filler 52 of FIG. 2B. Heavily boron-doped (p+) polycrystalline silicon etches much faster in KOH etchant than n+polycrystalline silicon that can be used for the "further" layer 51. The FIG. 2C stage may therefore be obtained by etching with KOH. Other possibilities are, for example, PSG (phosphosilicate glass) and ozone-formed TEOS, both of which have a fast etch rate and good etch selectivity with respect to silicon dioxide. Either PSG or ozone-TEOS may be used for the sacrificial filler 52.

SECOND EMBODIMENT

FIGS. 3A to 3D

Figure 3A:
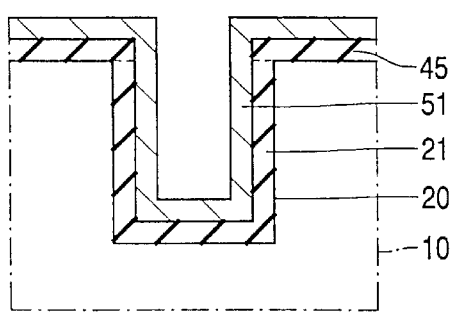
FIGS. 3A to 3D are similar cross-sectional views of a trench-gate area of the MOSFET at successive stages in its manufacture by process steps in accordance with another embodiment of the invention, with an electrode (field plate) filler material.
Figure 3B:
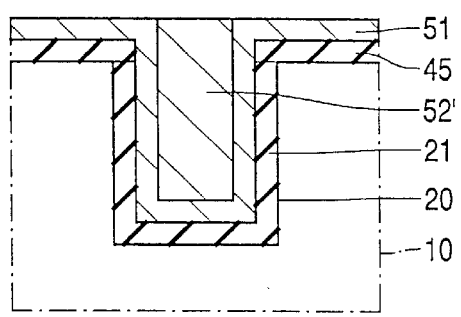
Figure 3C:
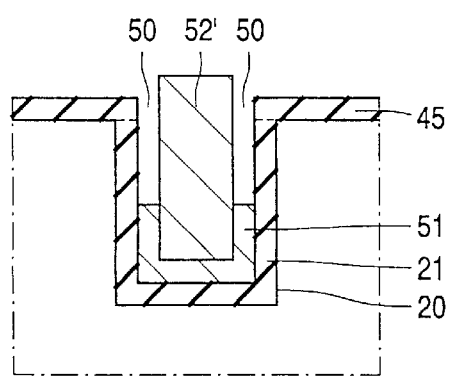
Figure 3D:
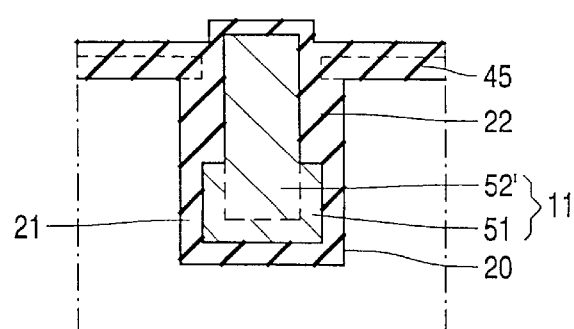

This embodiment is similar to the first embodiment in that it employs an electrode material (for example, doped polycrystalline silicon) for the further layer 51. It differs in also using an electrode material 52' (for example, comprising a mixed germanium-silicon alloy) for the filler material. Both this filler material 52' and the lower part of the further layer 51 are retained in the manufactured device as respective upper and lower parts of the electrode 11. The resulting trench-gate structure is illustrated in FIG. 3D.

These electrode materials 51 and 52' are selectively etchable with respect to each other, for example using KOH to etch the polycrystalline silicon. Similar process stages FIGS. 3A to 3D may be followed as for FIGS. 2A to 2D of the first embodiment. A mixed germanium-silicon alloy is oxidation-resistant material. Thus, the upper part of the trench walls can be oxidised to form the thicker upper insulating layer 22 of silicon dioxide when using a mixed germanium-silicon alloy for the filler material 52'. However, the upper insulating layer 22 may alternatively be formed by deposition of silicon dioxide (TEOS). As compared with the first embodiment, an advantage of this second embodiment is a reduction in the number of process steps required to form the insulated trench 20,21,22 with its electrode 11 (51,52').

THIRD EMBODIMENT

FIGS. 4A to 4G

This embodiment employs an insulating material and/or an oxidation resistant material (for example, silicon nitride) for the further layer 51'. An electrode material (for example, doped polycrystalline silicon) may be used for the filler material 52". Whatever specific materials are used, the further layer 51' is selectively etchable with respect to the filler material 52".

The trench 20 is etched in known manner into the surface 10a of the silicon body 10. The gate dielectric layer 21 may then be formed in known manner (for example, by oxidation of the silicon trench walls) to line the walls and bottom of the trench 20. Only a thin layer 21 is formed in an embodiment in which the insulating further layer 51' is retained in the manufactured device as part of the gate dielectric. In this case, the layer 21 is typically less than 50 nm (nanometres) thick. The resulting structure is illustrated in FIG. 4A.

Next, a material such as silicon nitride may be deposited to form the further layer 51', as illustrated in FIG. 4B. An electrode material 52" (such as doped polycrystalline silicon) may then be deposited over the layer 51'. The deposited electrode material 52" is etched back so as to be left only in the lower part of the trench 20, i.e. it is left only in the trench 20 at a required height that corresponds to a transition between the upper and lower parts of the trench 20. The resulting structure is illustrated in FIG. 4C.

While using the filler material 52" as an etchant mask, the exposed silicon nitride 51' is etched away so as to expose the upper part of the trench walls (or at least to expose the insulating layer 21 thereon). This etching step is less critical than that for the layer 51 in FIGS. 2B and 3B, because it does not require any carefully timed etching along the length of a layer, parallel to the trench walls. As illustrated in FIG. 4D, the resulting space 50 (adjacent to the upper part of the trench walls) that is exposed by the remaining nitride 51' extends across the whole upper part of the trench 20.

Next, the upper part of the trench walls may be oxidised to form the thicker upper insulating layer 22, while using the silicon nitride layer 51' as an oxidation mask in the lower part of the trench. However, instead of thermal oxidation, TEOS deposition may be used to form the upper insulating layer 22 of silicon dioxide. The silicon dioxide is then etched back with a directional etch to re-expose the electrode filler material 52", while leaving oxide spacers on the upper walls of the trench. This etch-back may also expose the top corner of the trench 20. The resulting structure is illustrated in FIG. 4E.

If the process is such as to also expose the top corner of the trench 20, then it is advantageous for the highly-doped n-type region 14 (n+) to be present already at the surface 10a. A further oxidation may then be performed to insulate this exposed top corner with a thick oxide, while growing only a thin oxide on the polycrystalline silicon 52". This is achievable because a high rate of oxide growth occurs on highly-doped n-type (n+) silicon. The thin oxide may then be etched away from the polycrystalline silicon 52" while leaving a thick oxide on the n+ top corner of the trench 20. The resulting structure is illustrated in FIG. 4F.

Figure 4G:
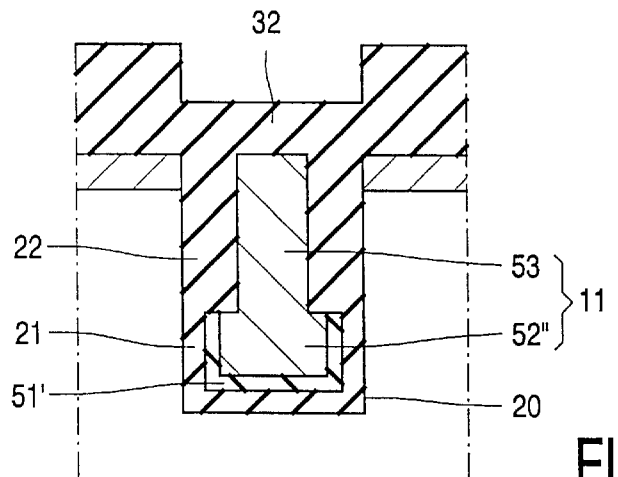

Thereafter electrode material 53 is deposited in the upper part of the trench 20 to provide the remainder of the electrode 11 with the electrode filler material 52". An overlayer 32 of TEOS may then be deposited, or a thermal oxide overlayer 32 may be grown. The resulting structure is illustrated in FIG. 4G.

Many modifications will be apparent. Thus, the filler material 52" need not be of electrode material and need not be retained in the manufactured device. It is possible to etch away the filler material 52" before the thick upper insulating layer 22 is formed by oxidising the upper part of the trench walls.

When the layer 51' is of silicon nitride, it may be retained in the manufactured device adjacent to the lower insulating layer 21. The resulting device has a compound gate dielectric 21,51'. However, the further layer 51' could even be of an electrode material (for example, a mixed germanium-silicon alloy) that is retained in the manufactured device as a lower part of the electrode 11 in the insulated trench 20,21,22. Alternatively, the layer 51' may be etched away before depositing electrode material 53 in the insulated trench 20,21,22. In this case, this later deposited electrode material 53 fills the insulated trench 20,21,22 and forms the whole of the electrode 11.

The further layer 51' and the filler material 52" may be of selectively-etchable oxidation-resistant materials. One may be of, for example, a mixed silicon-germanium alloy, and the other of silicon nitride. Both may then be present as an oxidation mask in the lower part of the trench 20, when the upper insulating layer 22 is formed by oxidation.

FOURTH EMBODIMENT

FIGS. 5A to 5H

This embodiment uses a sacrificial layer 51' and a sacrificial filler material 52". In the specific example now to be described, the sacrificial layer 51' comprises silicon nitride as an oxidation-resistant material, and the sacrificial filler material 52" is polycrystalline silicon as being suitable for selective etching.

The process stages of FIGS. 5A to 5D are similar to those of FIGS. 4A to 4D, except that the thickness of the insulating layer 21 is chosen to provide the whole of the gate dielectric 21 for the manufactured device.

Figure 5A:
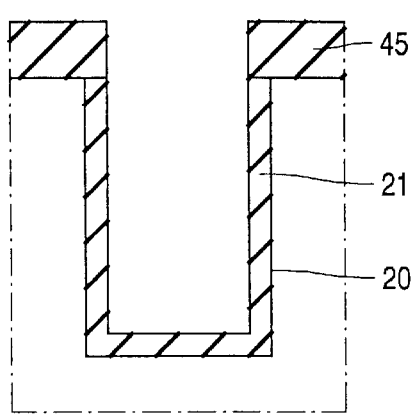
FIGS. 5A to 5H are similar cross-sectional views of a trench-gate area of the MOSFET at successive stages in its manufacture by process steps in accordance with yet another embodiment of the invention, with a sacrificial further layer.
Figure 5B:
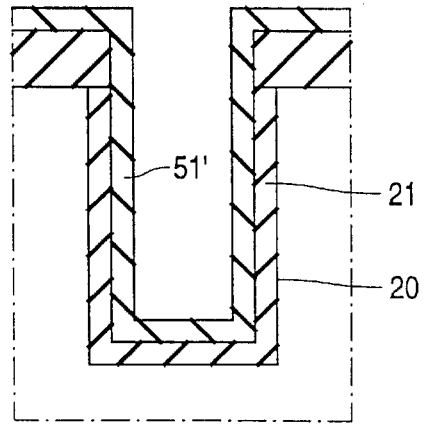
Figure 5C:
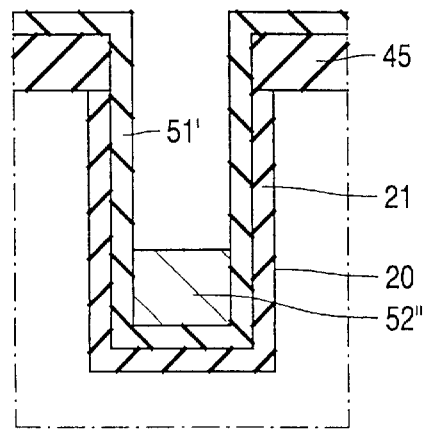
Figure 5D:
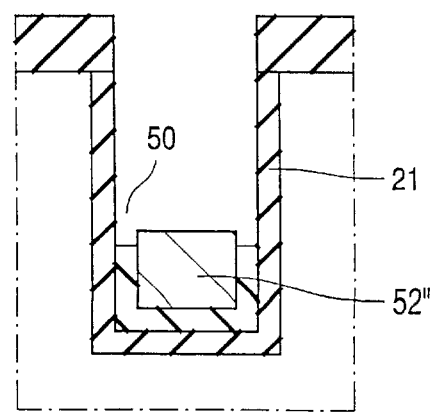
Figure 5E:
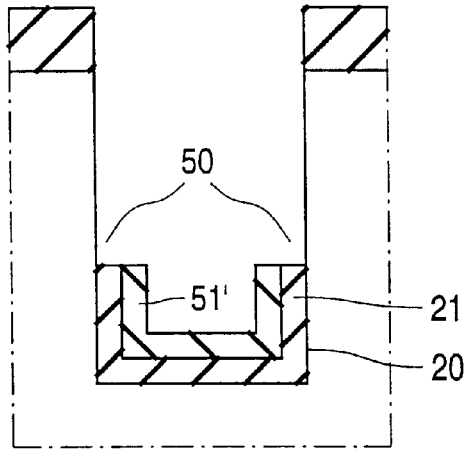

Next, the filler material 52" is etched away. The silicon dioxide layer 21 is also etched away from the upper part of the trench where it is not masked by the silicon nitride layer 51'. The resulting structure, as illustrated in FIG. 5E, has bare silicon walls to the upper part of the trench 20.

Figure 5F:
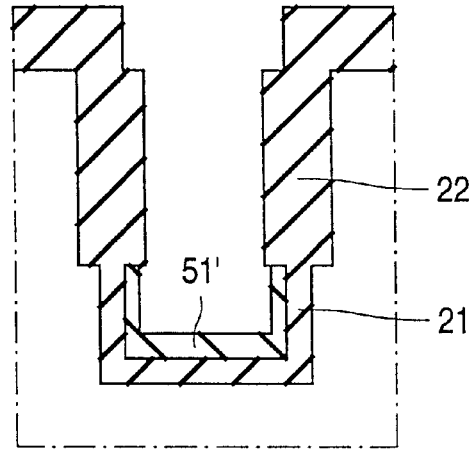
Figure 5G:
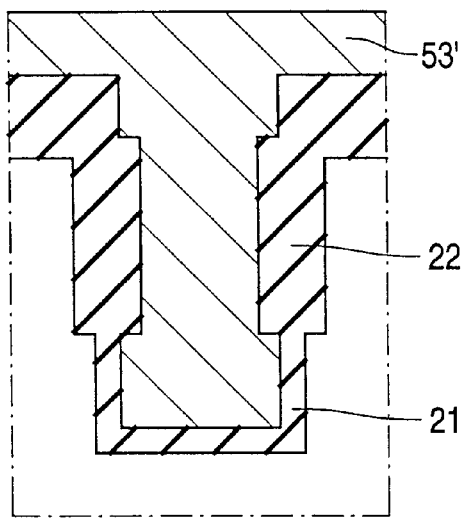

Using the silicon nitride layer 51' as a mask, thermal oxidation of the bare silicon is then carried out to form the thick upper insulating layer 22, as shown in FIG. 5F.

The layer 51' is then etched away from the lower part of the trench using a selective etchant that does not attack the oxide layer 22. Thereafter, doped polycrystalline silicon or another electrode material 53' is deposited to form the structure shown in FIG. 5G.

Figure 5H:
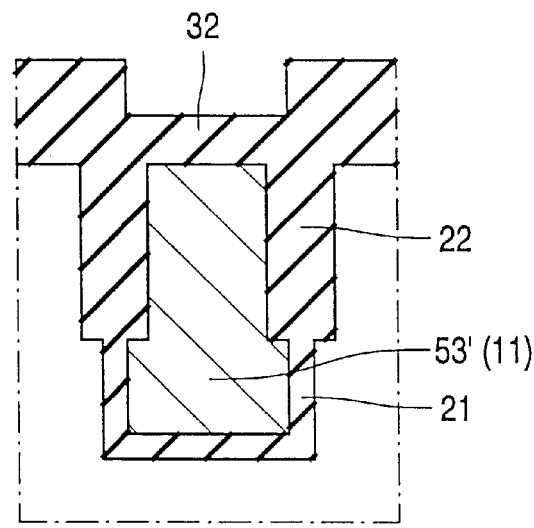

The electrode material 53' is then etched back from off the top of the body 10 but is left in the insulated trench 20,21,22 to form the electrode 11. TEOS deposition can be carried out to provide the oxide layer 32 over the electrode 11 in the insulated trench 20,21,22. The resulting structure is illustrated in FIG. 5H.

DIFFERENT DEVICE EMBODIMENTS

FIGS. 1, 6, & 7

Such processes for forming the insulated trench 20,21,22 in accordance with the present invention are particularly advantageous for providing a trench-gate 11 of an inverted power MOSFET device, such as that shown in FIG. 1. Thus, the thin lower insulating layer 21 can provide the gate dielectric that couples the gate electrode 11 to the channel-accommodating region 15a. The upper part of the gate electrode 11 can function as a field plate across the thicker upper insulating layer 22 that separates it from most of the drain drift region 14a, as well as from the high doped drain region 14. Quite high voltages, for example, about 100 volts may be applied to the drain electrode 33, with respect to the source and gate electrodes. However, processes for forming an insulated trench 20,21,22 in accordance with the present invention are also advantageous in other device contexts.

Figure 6:
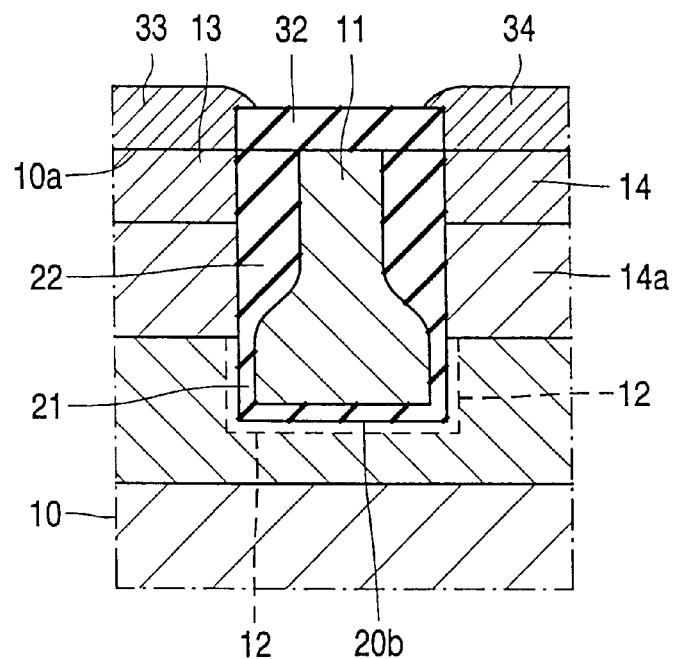
FIG. 6 is a cross-sectional view of a trench-gate area of a different trench-gate MOS transistor (an EEPROM-type MOST) manufactured by a method in accordance with the invention.

Thus, for example, FIG. 6 illustrates the provision of such an insulated trench 20,21,22 in an EEPROM-type MOS transistor. In this case, both the source and drain regions 13 and 14 are present adjacent to the thick insulating layer 22 at the body surface 10a. The source and drain regions 13 and 14 are at opposite sides of the trench 20. The trench 20 is etched into (but not through) the channel-accommodating region 15a of the device. The lower insulating layer 21 provides the gate dielectric adjacent to the channel 12 that is formed around the bottom 20b of the trench, as well as along the lower part of its side walls. This trench-gate field-effect structure may be used for an EEPROM, for example as in WO 99/43029.

Figure 7:
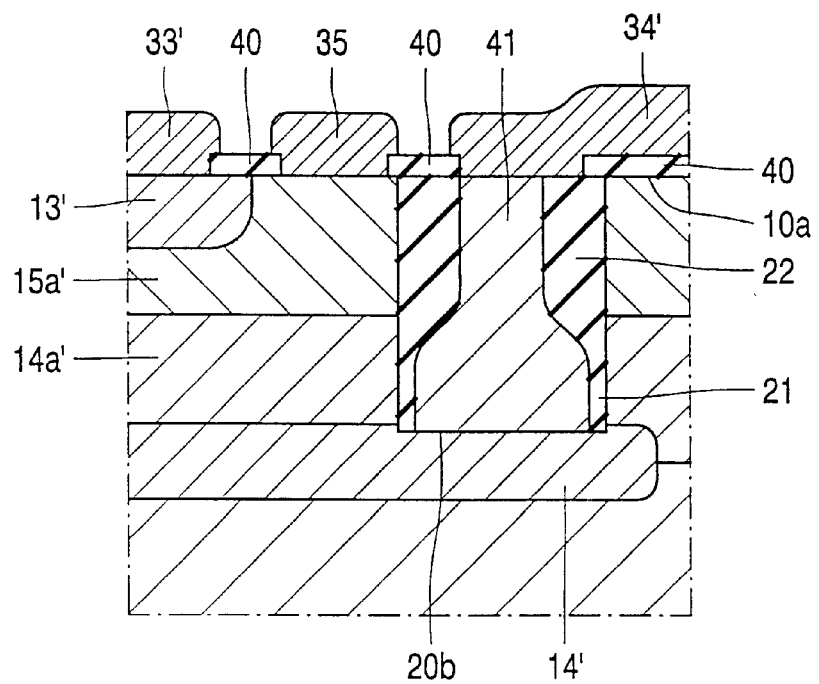
FIG. 7 is a cross-sectional view of a trench-electrode area of a further semiconductor device (bipolar transistor) manufactured by a method in accordance with the invention.

FIG. 7 illustrates a different situation, in which the bottom 20b of the trench 20 is free of the lower insulating layer 21. In this case, the insulated trench 20,21,22 contains an electrode 41 that contacts a region 14' of the body 10 at the bottom 20b of the trench 20. Thus, the trench 20 provides an insulated via for the electrode 41 from the body surface 10a to a buried region 14' of the body 10. In the case of a discrete device or integrated circuit comprising a transistor, this electrode 41 may be, for example, a collector connection or a drain connection.

The trench 20 of the FIG. 7 device may be formed with an exposed thin insulating layer 21 both at the trench bottom 20b and at its side walls. Then, the insulating layer 21 can be removed from the trench bottom 20b by directional (i.e. anisotropic) etching before depositing the further layer 51,51' or before depositing electrode material 53' to fill the insulated trench 20,21,22.

As FIGS. 1 and 6 show field-effect transistors, FIG. 7 has been chosen to show a bipolar transistor for the sake of variety. This bipolar transistor has an emitter region 13', a base region 15a', a low-doped collector part 14a' and a collector buried layer 14'. Emitter, collector and base electrodes 33', 34', and 35 respectively contact the emitter region 13', the collector connection 41, and the base region 15a' at windows in an insulating layer 40 on the body surface 10a. The thick upper insulating layer 22 separates the collector connection 41 from the base region 15a'.

All the trench sections shown in FIG. 1 accommodate the insulated trench gate 11 and have the lower insulating layer 21 at the bottom 20b of the trench. However, the MOSFET device of FIG. 1 may comprise a network (or group) of trenches 20 that accommodate the gate 11, and one or more separate trenches 20' that accommodate a source electrode 41'. This source electrode 41' contacts the source region 13 at the un-insulated bottom 20b' of the trench 20', in a similar manner to the electrode 41 of FIG. 7.

From reading the present disclosure, other variations and modifications will be apparent to persons skilled in the art. Such variations and modifications may involve equivalents and other features which are already known in the design, manufacture and use of semiconductor devices, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

We claim:

1. A method of manufacturing a semiconductor device having an electrode provided in an insulated trench, trench walls of which are lined with a lower insulating layer in a lower part of the trench and with a thicker upper insulating layer in an upper part of the trench, wherein the insulated trench is formed by process steps that include:

(a) etching the trench into a semiconductor body from one surface of the body, (b) providing the lower insulating layer on the trench walls, (c) depositing on the lower insulating layer a further layer of a different material from that of the lower insulating layer, (d) depositing on the further layer a filler material that is of a different material from the further layer, (e) etching away the further layer from the upper part of the trench walls while using the filler material as an etchant mask, so as to form a space adjacent to the upper part of the trench walls while leaving the further layer in the lower part of the trench, and (f) providing the thicker upper insulating layer in the space adjacent to the upper part of the trench walls.

2. A method as claimed in claim 1, wherein the filler material extends in both the lower and upper parts of the trench so that the space formed in step (e) is present between an upper part of the filler material and the upper part of the trench walls, and the thicker upper insulating layer is formed by depositing insulating material in the space between the filler material and the upper part of the trench walls.

3. A method as claimed in claim 2, wherein which the filler material comprises silicon nitride, and silicon dioxide is deposited to provide the thicker upper insulating layer, after which a selective etchant is used to etch away the filler material from the upper insulating layer of silicon dioxide.

4. A method as claimed in claim 1, wherein the deposited filler material is etched back so as to be left in only the lower part of the trench so that the space formed in step (e) extends across the upper part of the trench, and the thicker upper insulating layer is formed by depositing insulating material in the upper part of the trench and etching back the deposited insulated material with a directional etch so as to be left as spacers on the upper part of the trench walls.

5. A method as claimed in claim 1, wherein the semiconductor body is of silicon, the filler material comprises oxidation-resistant material, and the upper part of the trench walls are oxidised to form the thicker upper insulating layer of silicon dioxide while using the filler material as an oxidation mask in the lower part of the trench.

6. A method as claimed in claim 5, wherein the filler material comprises silicon nitride that is etched away from the upper insulating layer of silicon dioxide with a selective etchant after forming the upper insulating layer by oxidation.

7. A method as claimed in claim 2, wherein the filler material comprises an electrode material that is retained in the manufactured device as a part of the electrode in the trench.

8. A method as claimed in claim 7, wherein the filler material comprises a mixed germanium-silicon alloy as its electrode material.

9. A method as claimed in claim 1, wherein the further layer comprises an electrode material that is retained in the manufactured device as a lower part of the electrode in the trench.

10. A method as claimed in claim 9, wherein the further layer comprises doped polycrystalline silicon as its electrode material.

11. A method as claimed in claim 1, wherein the semiconductor body is of silicon, the further layer comprises oxidation-resistant material, and the upper part of the trench walls are oxidised to form the thicker upper insulating layer while using the further layer as an oxidation mask in the lower part of the trench.

12. A method as claimed in claim 11, wherein the filler material is removed before oxidising the upper part of the trench walls to form the thicker upper insulating layer, and electrode material is deposited in at least the upper part of the trench after the oxidation.

13. A method as claimed in claim 4, wherein the further layer is etched away from the lower part of the trench after forming the thicker upper insulating layer by oxidation, and thereafter electrode material is deposited to provide the electrode in the insulated trench.

14. A method as claimed in claim 4, wherein the further layer is of electrode material that is retained in the manufactured device as a lower part of the electrode in the insulated trench.

15. A method as claimed in claim 4, wherein the further layer is of silicon nitride that is retained in the manufactured device adjacent to the lower insulating layer.

16. A method as claimed in claim 1, wherein the electrode is a trench-gate of a field-effect device having a channel-accommodating region in the body, the trench is etched into the channel-accommodating region, the lower insulating layer is provided on the bottom of the trench as well as on the lower part of its side walls, and source and/or drain regions are formed in the body adjacent to the thicker upper insulating layer.

17. A method as claimed in claim 16, wherein the field-effect device is an inverted transistor having drain regions adjacent to the thicker upper insulating layer, and the trench extends through the thickness of the channel-accommodating region to reach an underlying source region adjacent to the lower insulating layer.

\* \* \* \* \*